(12) United States Patent
Botham

(10) Patent No.: US 6,872,007 B2
(45) Date of Patent: Mar. 29, 2005

(54) OPTICAL LINE-OF-SIGHT INTER-BOARD DATA TRANSFER

(75) Inventor: Michael P. Botham, Chelmsford, MA (US)

(73) Assignee: Tektronix, Inc., Beaverton, OR (US)

( * ) Notice: Subject to any disclaimer, the term of this patent is extended or adjusted under 35 U.S.C. 154(b) by 191 days.

(21) Appl. No.: 10/254,189

(22) Filed: Sep. 24, 2002

(65) Prior Publication Data

US 2004/0057669 A1 Mar. 25, 2004

(51) Int. Cl.⁷ .................................................. G02B 6/36
(52) U.S. Cl. ........................................... 385/53; 385/88
(58) Field of Search .............................. 385/53, 88, 134

(56) References Cited

U.S. PATENT DOCUMENTS

| | | | |
|---|---|---|---|
| 5,224,184 A | 6/1993 | Boudreau | |
| 5,267,039 A | 11/1993 | Elberbaum | |
| 5,488,682 A | 1/1996 | Sauter et al. | |
| 5,570,372 A | 10/1996 | Shaffer | |
| 5,726,786 A | 3/1998 | Heflinger | |
| 5,818,514 A | 10/1998 | Duttweiler et al. | |
| 5,953,049 A | 9/1999 | Horn et al. | |
| 6,030,232 A * | 2/2000 | Haggard et al. | 439/64 |
| 6,351,233 B1 | 2/2002 | Takenaka | |
| 6,474,860 B2 * | 11/2002 | Wojnarowski et al. | 362/555 |
| 6,603,662 B1 * | 8/2003 | Ganrot | 361/698 |
| 6,650,884 B1 * | 11/2003 | Wiegers et al. | 455/344 |

FOREIGN PATENT DOCUMENTS

| | | | |
|---|---|---|---|
| EP | 0 845 903 | 6/1998 | |
| EP | 1 098 522 | 5/2001 | |
| EP | 1168677 A2 | 1/2002 | ........... H04B/10/10 |
| JP | 2041042 | 2/1990 | ........... H04B/10/20 |
| JP | 9044272 | 2/1997 | ............. G06F/1/18 |
| JP | 2001196626 | 7/2001 | ........... H01L/31/12 |
| WO | WO 0178265 | 10/2001 | ........... H04B/10/10 |

* cited by examiner

Primary Examiner—John D. Lee
Assistant Examiner—Tina M Lin
(74) Attorney, Agent, or Firm—Francis I. Gray

(57) ABSTRACT

An optical line-of-sight inter-board data transfer configuration for circuit boards mounted in a card cage or other suitable mounting mechanism has an array of light emitting devices and an array of light detecting devices mounted on each circuit board such that, when the circuit boards are mounted in the card cage, each light emitting device of one circuit board is aligned with a corresponding light detecting device on an adjacent circuit board. Data is modulated onto collimated light that is transmitted from the light emitting devices via a gas (air) or free space medium to corresponding ones of the light detecting devices. In this way high data rates in the gigahertz range may be achieved between circuit boards, avoiding the bottleneck imposed by a backplane of the card cage.

5 Claims, 1 Drawing Sheet

OPTICAL LINE-OF-SIGHT INTER-BOARD DATA TRANSFER

BACKGROUND OF THE INVENTION

The present invention relates to data transfer between circuit boards in a card cage, and more particularly to an optical line-of-sight inter-board data transfer.

Generally when two or more circuit boards are mounted in a common enclosure or card cage, there is a need to communicate or transfer data between the boards. The common enclosure usually includes a backplane into which the circuit boards connect, and the data transfer occurs across a data bus incorporated into the backplane. Such data buses use electrical wires to transfer data between the different circuit boards on the data bus. Such interconnections require an electrical connection to the circuit board via either an electrical connector or a more permanent attachment. Applications that require removal of circuit boards from the cage use electrical connectors which are susceptible to damage and can experience failure. Further the data bandwidth of such data buses is limited. Data transmission over electrical backplanes is currently in the hundreds of megahertz. With telecommunications systems reaching data rates in the gigahertz range, the transfer of data across these data buses becomes a definite bottleneck.

The introduction of the fiber optic data bus by replacing the electrical wire with optical fiber has not alleviated all these problems. U.S. Pat. No. 5,488,682 discloses a polymer-based optical connector for interconnecting a plurality of operational modules which has a polymer backplane for supporting a plurality of polymer waveguides on a formable substrate. Each end of each waveguide has to be precisely located adjacent a spherical ball lens located in a precision recess formed in the substrate, with a transparent window mounted opposite each ball lens. In this way light is coupled from fiber on a module or circuit board to fiber on the backplane. This system requires precision alignment. This optical fiber connector, as well as other types of optical fiber connectors and splices that replace the electrical connectors and joints, are also susceptible to physical damage and can experience failure.

Optical data transmission through free-space has been long used to enable communication over varying distances ranging from micrometers in micro circuits to extraterrestrial distances. Free-space is the spatial medium through which light propagates without the aid of a conduit such as an optical fiber, light pipe, wave guide or the like. U.S. Pat. No. 5,224,184 discloses an optical multi-chip interconnect for optically connecting optical signals between chips using interposed lens. The chips transmit light from the edge of one chip to the edge of another via the lens over very short distances—10 to 1000 microns. Generally such devices broadcast to multiple receivers using uncollimated light.

U.S. Pat. No. 5,726,786 discloses a free-space star-coupled optical data bus whereby several subsystems communicate with each other in a broadcast manner using a specified protocol so that only the intended receiver actually accesses the broadcast data. This system requires a certain amount of overhead to process the protocol in order to determine whether the transmitted data is intended for a specific receiver.

What is desired is a method of reliably transmitting data at high rates between adjacent circuit boards in a card cage without using a backplane data bus while allowing the boards to be inserted or removed independently of one another.

BRIEF SUMMARY OF THE INVENTION

Accordingly the present invention provides an optical line-of-sight inter-board data transfer configuration for circuit boards mounted in a card cage or other suitable mounting mechanism. An array of light emitting devices and an array of light detecting devices are mounted on each circuit board such that, when the circuit boards are mounted in the card cage, each light emitting device of one circuit board is aligned with a corresponding light detecting device on an adjacent circuit board. Data is modulated onto collimated light that is transmitted from the light emitting devices via a gas (air) or free space medium to corresponding ones of the light detecting devices. In this way high data rates in the gigahertz range may be achieved between circuit boards, avoiding the bottleneck imposed by a backplane of the card cage.

The objects, advantages and other novel features of the present invention are apparent from the following detailed description when read in conjunction with the appended claims and attached drawing.

DETAILED DESCRIPTION OF THE INVENTION

Figure 1:
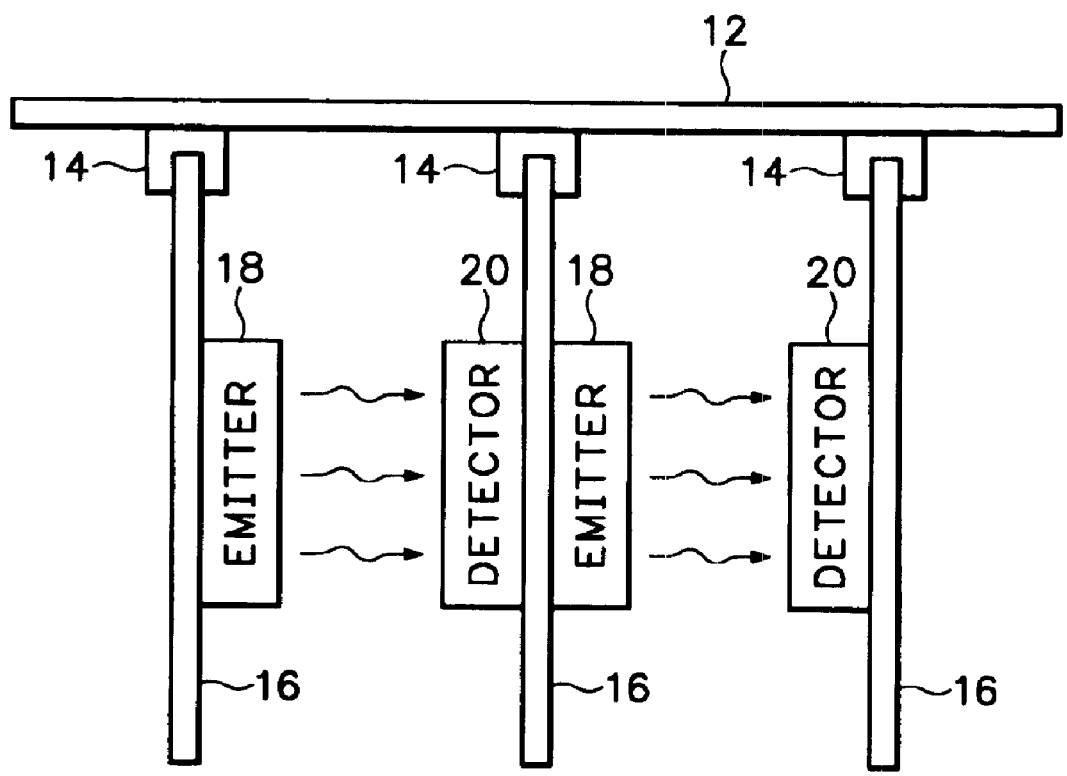
FIG. 1 is a simple plan view of circuit boards in a card cage that transmit data according to the present invention.

Referring now to FIG. 1 a card cage backplane 12 is shown on which several circuit interconnects 14 are mounted. One or more circuit boards 16 may be mounted on the backplane 12 via respective ones of the circuit interconnects 14. Each circuit board has an array 18 of light emitting elements mounted at a first specified location and a similar array 20 of light detecting elements mounted at a second specified location. The specified locations are such that when two circuit boards 16 are mounted in their respective circuit interconnects 14 the array 18 of light emitting elements on one board is aligned with the array 20 of light emitting elements on the second board such that each element of the emitting array propagates its light to a corresponding element of the detecting array. The medium of transmission is the air within the card cage—or vacuum if the card cage is evacuated.

This transmission relies on the ability of the card cage to position the emitting and detecting arrays 18, 20 such that the emitted light repeatedly aligns with the corresponding detector. Focusing lenses may be used on either the emitter array 18 or detector array 20 or both to make misalignment less critical. The transmitted light is collimated to transmit in a point-to-point fashion. Data to be transmitted between the two circuit boards 16 may be encoded on the emitted light in a variety of ways. Simple non-return to zero (NRZ) encoding suffices for many applications. This is simply turning on the light to represent one state of a binary bit and turning off the light to represent the opposite state. More sophisticated coding may be used to reduce signaling errors or to increase bandwidth.

Transmission bandwidth varies depending on the quality of the light sources making up the emitter array 18 and the modulation method, as well as the bandwidth, sensitivity and size of the detectors in the detector array 20. At the low end of the scale a simple light emitting diode (LED) may be used as the light source and a photodiode as the detector. At the high end of the scale an array of vertical cavity lasers may be used as the emitter array 18 and PIN diodes with bandwidth in excess of 10 GHz as the detector array 20. The tradeoff is one of cost versus performance.

Using a standard configuration for the location of the arrays 18, 20, which may be on one side, both sides or a combination thereof, any circuit board 16 may be inserted or removed from the card cage interconnects 14 and any two adjacent circuit boards existing in the card cage may transfer data using this optical line-of-sight inter-board transfer system.

Thus the present invention provides for high data rate transfer between adjacent circuit boards in a card cage by using an optical line-of-sight inter-board transfer system that has an array of emitting elements on one board aligned, when mounted in the card cage, with a corresponding array of detecting elements on the adjacent board such that collimated light modulated by data from each emitting element impinges only on the corresponding detecting element using the space between the boards—gas (air) or vacuum—as the transmission medium.

What is claimed is:

1. An apparatus for optical line-of-sight inter-board data transfer of the type having a backplane with circuit connectors to which circuit boards are detachedly coupled for communicating with each other over the backplane comprising:

a first array of light emitting devices situated at a first predetermined location on each circuit board, the light emitting devices emitting collimated light;

a second array of light detecting devices situated at a second predetermined location on each circuit board for detecting the collimated light from corresponding light emitting devices of the first array, the first and second predetermined locations being aligned when the circuit boards are coupled to the backplane via the circuit connectors such that the light emitting devices of the first array on one circuit board are aligned with corresponding ones of the light detecting device of the second array on an adjacent circuit board to provide a high data rate transmission path between circuit boards; and means for focusing light from each light emitting device onto a specific one of the light detecting devices.

2. The apparatus as recited in claim 1 wherein the light emitting devices comprise lasers selected from the group consisting of light emitting diodes and vertical cavity lasers.

3. The apparatus as recited in claim 1 or 2 wherein the light detecting devices comprise detectors selected from the group consisting of photodiodes and PIN diodes.

4. The apparatus as recited in claim 1 wherein the focusing means comprises a lens in a light path between each light emitting device and the corresponding light detecting device.

5. The apparatus as recited in claim 1 or 4 further comprising means for modulating data onto each light emitting device for transmission to the corresponding light detecting device.

* * * * *